(12) United States Patent  
Schubert (10) Patent No.: US 7,110,303 B2  
(45) Date of Patent: Sep. 19, 2006

(54) MEMORY CELL TESTING FEATURE

(75) Inventor: Richard P. Schubert, Medfield, MA (US)

(73) Assignee: Analog Devices, Inc., Norwood, MA (US)

( * ) Notice: Subject to any disclaimer, the term of this patent is extended or adjusted under 35 U.S.C. 154(b) by 209 days.

(21) Appl. No.: 10/786,511

(22) Filed: Feb. 25, 2004

(65) Prior Publication Data

US 2005/0185473 A1   Aug. 25, 2005

(51) Int. Cl.  
*G11C 16/04* (2006.01)

(52) U.S. Cl. .................. 365/189.01; 365/203; 365/204

(58) Field of Classification Search ............. None  
See application file for complete search history.

(56) References Cited

U.S. PATENT DOCUMENTS

| | | | |
|---|---|---|---|
| 5,559,745 A | 9/1996 | Banik et al. | |
| 5,920,517 A | 7/1999 | Wendell | |
| 5,930,185 A | 7/1999 | Wendell | |
| 6,243,297 B1 * | 6/2001 | Nagatomo | 365/185.25 |
| 6,363,500 B1 * | 3/2002 | Hamada | 365/201 |
| 6,657,886 B1 * | 12/2003 | Adams et al. | 365/154 |
| 6,807,124 B1 * | 10/2004 | Tsuda et al. | 365/230.03 |

OTHER PUBLICATIONS

"Data Retention System", IBM Technical Disclosure Bulletin, May 1975, pp. 1 2.  
"Checking Random Access Memory", IBM Technical Disclosure Bulletin, Mar. 1978, pp. 1-2.  
Ding-Ming Kwai et al., "Detection of SRAM Cell Stability by Lowering Array Supply Voltage", Proceedings of the 9th Asian Test Symposium, 2000 IEEE.  
Anne Meixner et al., "Weak Write Test Mode: An SRAM Cell Stability Design For Test", pp. 309-318, IEEE 1996.

* cited by examiner

*Primary Examiner*—David Lam  
(74) *Attorney, Agent, or Firm*—Wolf, Greenfield & Sacks, P.C.

(57) ABSTRACT

An electronic memory device includes at least one memory cell, a write circuit that defines an output node and mediates a discharge associated with a write operation flowing to the output node, and a write strength selection circuit that modifies at least one characteristic of the discharge. A method for testing data retention of an electronic memory device includes providing a write circuit, storing a value in at least one memory cell of the memory device, directing a weak write operation to the at least one memory cell, and sensing the memory cell to determine if the stored value changed in response to the weak write operation.

21 Claims, 5 Drawing Sheets

MEMORY CELL TESTING FEATURE

BACKGROUND OF INVENTION

1. Field of Invention

The invention relates to the field of integrated circuit memory devices. More particularly, the invention relates to apparatus and methods for testing memory cells in integrated circuit memory devices.

2. Discussion of Related Art

Memory embedded in microprocessors, such as static random-access memory (SRAM), can be susceptible to data storage errors. Microprocessors are often used in applications that require infrequent reads and writes of memory cells and flip-flops. In embedded and low power applications, for example, the microprocessor may be placed in a low-power mode of operation in which it suspends access to memory for a time span of anywhere from several seconds to hours or days. Unfortunately, manufacturing defects can cause data values stored in memory cells or flip-flops to change state over time (e.g., a stored logic-1 erroneously becomes a logic-0, or vice versa). Thus, device manufacturers and purchases often perform data retention tests on each microprocessor to test the ability of the memory to retain stored data for a desired period of time.

A typical SRAM cell is fabricated via standard integrated circuit methods. Because it is often desirable to provide the greatest possible amount of memory in the smallest possible circuit area, SRAM cells are often formed with minimal component dimensions. SRAM cells are thus susceptible to manufacturing defects. Such defects can lead to complete failure of a cell, or cause the cell to leak current and thus fail to retain stored data for a required period of time.

Unfortunately, manufacturing defects that cause data retention problems can be more difficult to detect than defects that prevent storage. Defects sometimes occur in the semiconductor and metal structures of an integrated circuit during such a manufacturing process. Such manufacturing defects can cause failures in the contacts in the SRAM cells or in the individual transistors in the SRAM cells. A symmetric defect impairs the performance of both of the cross-coupled devices of the cell. A defective contact in a power supply line, which normally supplies power to the entire memory cell, is considered a symmetric defect since both cross coupled devices are left without power. In contrast, an asymmetric defect normally impairs only one of the cross-coupled devices. A defective pull-up in one inverter is an example of an asymmetric defect.

Weak cells can be identified by observing the behavior of cells over a period of time. This approach can be unacceptably time consuming, and can lead to uncertain outcomes because different types of defects can cause a cell to retain data for different lengths of time. Another approach is to test more devices simultaneously. This solution, however, can require the use of greater numbers of costly test instruments. A third approach is to add to each column of memory cells an on-chip weak-write test circuit. This solution, however, can add substantial amounts of circuitry to a convention SRAM design.

SUMMARY OF INVENTION

The invention features, in part, apparatus and methods that provide rapid and accurate testing of memory cell functioning, and failure mode determination for failing memory cells. The invention arises in part from the realization that a memory cell can be tested by intercepting a write operation discharge to provide a weak write strength. A weakly written cell can be sensed to determine if a stored value has been changed. The strength of the weak write operation can be varied to identify the failure mode of the defective memory cell.

According to principles of the invention, a conventional SRAM can be modified to include two or more components, such as transistors, to intercept a write discharge that would otherwise go to ground in the conventional design. The two or more components can provide discharge control for all columns of the modified SRAM. Thus, the addition of a relatively small circuit to an SRAM can enable rapid identification of data retention failures, as well as identification of the type of defects causing the failures.

Accordingly, in a first aspect, the invention features an electronic memory device. The device includes at least one memory cell, such as an SRAM cell, a write circuit, and a write strength selection circuit. The write circuit and/or the write strength selection circuit define an output node to which flows a discharge associated with a write operation. The write circuit provides on/off connection between the at least one memory cell and the output node to permit the discharge to flow to the output node. The write strength selection circuit modifies at least one characteristic of the discharge flowing to the output node. For example, the write strength selection circuit can affect the magnitude and/or duration of the discharge current.

The write strength selector circuit can have a strong write state associated with a first value of the at least one characteristic, and a weak write state associated with a second value of the at least one characteristic. To modify the discharge, the write strength selection circuit can have a selectable first impedance and a selectable second impedance greater than the first impedance. The first impedance is associated with a strong write operation and a second impedance is associated with a weak write operation.

The write strength selection circuit can include a first transistor, to provide a strong write operation, and a second transistor, to provide the weak write operation. More generally, the write strength selection circuit can include a number of circuit elements electrically connected in parallel to the output of the write circuit, the circuit elements selectable in a various combinations to provide a different levels of weak write operations and at least one strong write operation. The circuit elements can include transistors each having, for example, a different gate parameter.

The device can include an output node stabilization circuit in electrical communication with the output node to charge the output node to a preselected voltage level, such as a supply voltage level or a ground voltage level. The stabilization circuit can be part of the write strength selection circuit.

In a second aspect, the invention features a method for testing data retention of an electronic memory device. The method includes providing a write circuit defining an output node, storing a value in the at least one memory cell, directing a weak write operation to the at least one memory cell by controlling the discharge flowing to the output node, and sensing the memory cell to determine if the stored value changed in response to the weak write operation.

The memory device can include an array of memory cells. The method can then include determining a strong write strength of the array by empirically determining and/or theoretically determining an appropriate overwrite strength for the array. For example, the weak write operation may be repeated, with successively lesser write strengths, until a stored value fails to change to determine a minimum write strength for successful nominal operation of the array of memory cells. Knowing this minimum write strength can be useful for the calibration of retention test data.

In a third aspect, the invention features a method for failure analysis of an electronic memory device. The method includes determining which cells of the memory device are weak. The method then includes a data retention test of a weak cell, for example, to determine a weak write strength level at which the cell changes its stored value. The weak write operation is repeated during the data retention test, with successively greater write strengths, until the stored value changes to determine a failure mode of the weak cell. Each independent failure mode may have an associated level of write strength necessary to change a stored value. The determination of the associated levels for failing cells may be used to sort failure modes within an array of memory cells.

To further aid in defect identification, known defects may be intentionally included within the array of memory cells used to imitate the behavior of anticipated manufacturing defects. These defects can then be used, for example, in the calibration of the above-described failure analysis method. These defects may be located in regions otherwise not used during normal functioning of the device, and thus may have no harmful affect on the nominal behavior of the array of memory cells.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

The terms "strong" and "weak" are used herein as would be understood by one having ordinary skill in the electronic solid-state memory arts. Thus, depending on context, "strong" may refer to, for example, a normal current level used to write to a memory cell, such as an SRAM memory cell, during routine operation of the memory cell. "Weak" may refer to a current level below that of the normal level. Strong and weak levels for a specific device are dependent on the design and fabrication of the specific device, among other factors. "Strong" and "weak", again depending on context, may refer to, for example, the ability of a memory cell to hold a stored value. For example, a defective memory cell that loses a stored value over a period of time that is too brief for a particular application may be referred to as "weak".

Figure 1:
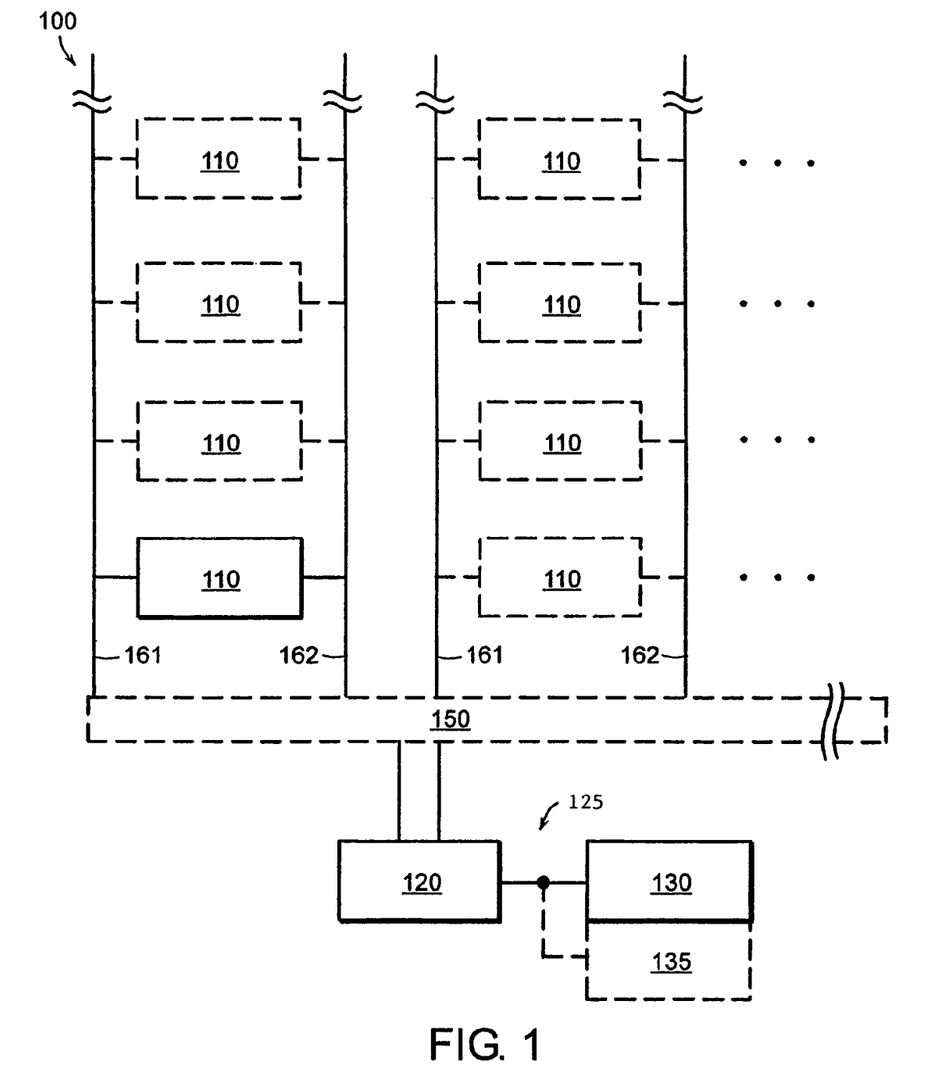
FIG. 1 is a block diagram of an embodiment of an electronic memory device, according to principles of the invention.

FIG. 1 is a block diagram of an embodiment of an electronic memory device 100 according to principles of the invention. As described in more detail below, the device 100 includes one or more memory cells 110, a write circuit 120 that defines an output node 125, and a write strength selection circuit 130. The write circuit 120 can connect the at least one memory cell 110 to the output node 125 during a write operation to permit a discharge associated with a write operation to flow to the output node 125.

In an alternative embodiment of the device 100, the device 100 is based on a modification of a conventional SRAM design. In this embodiment, the memory cells 110 are SRAM cells, and the device 100 includes bit and complementary bit lines 161, 162 for each column of memory cells 110. As known to one having ordinary skill in the SRAM arts, one of the bit and complementary bit lines 161, 162 can be discharged to write a "0" or a "1" to a cell of the SRAM. Typically, both the bit and complementary bit lines 161, 162 are precharged prior to the discharge associated with a write operation.

In this alternative embodiment, the write circuit 120 includes three inverters, as found in some conventional SRAMs, to selectably connect the bit or complementary bit line 161, 162 to the output node 125 in response to data write signals. The three inverters of a conventional SRAM write circuit typically direct the discharge directly to ground, i.e., the output node of a such a conventional device would typically be at ground. According to principles of the invention, the write selection circuit 130, however, intercepts and controls the discharge to provide a variable write strength. The conventional three-inverter circuit can quickly sink a relatively large load current to discharge a load capacitance, thereby pulling a voltage down to ground. The write strength selection circuit 130 can reduce the output driving capability of the conventional circuit.

Now returning to a more general description of the device 100, the write strength selection circuit 130 can alter the discharge associated with the write operation to provide one or more levels of strong and weak write operations. The write strength selection circuit 130 accomplishes this by controlling at least one characteristic of the discharge flowing to the output node 125. For example, the write strength selection circuit 130 can alter the magnitude of the current and/or the total charge flowing to the node, and/or alter the total charge discharged to ground.

The memory device 100 can also include a pass gate circuit 150 and/or an output node stabilization circuit 135. The pass gate circuit 150 provides switching for write operations so that a single write circuit 120 can be used to support more than one column, or all columns, of memory cells 110. The pass gate circuit 150 selectably connects the write circuit 120 to one or more of the columns to then permit the write circuit to selectably connect the columns to the output node 125.

In an alternative embodiment of the invention, each column of memory cells 110 is associated with its own write circuit 120. All write circuits 120 can then be connected to a single write strength selection circuit 130, and all write circuits 120 can then cooperatively define a single output node 125. In a further alternative embodiment, the device 100 can include separate write strength selection circuits 130 for two or more columns of memory cells 110, and separate output nodes 125 can be associated with each of the write strength selection circuits 130.

The output node stabilization circuit 135 is connected to the output node 125 to permit charging of the output node to a preselected voltage level, such as a supply voltage level or a ground voltage level. This can be desirable because the output node 125 can reside at a somewhat unknown voltage level after a write operation. The unknown voltage level can be due to any one or more of a number of undesirable dependencies that include, but are not limited to: 1) the strength of a cell previously written to; 2) the rate and number of writes performed sequentially; and 3) the leakage of the output node to other nodes of a device, such as a ground node, due to the imperfect isolation that is typical of nodes in integrated circuits. Without precharging of the output node 125, a subsequent write operation can then have a somewhat unpredictable initial impact as the output node 125 is connected to the memory cell 110, resulting in an inconsistent write strength.

Moreover, the output node 125 can be charged to a ground voltage level to, for example, increase a strength of a write operation, or charged to a supply voltage level to, for example, decrease a strength of a write operation. For example, assuming that the device 100 is an SRAM and that the ratio of a bit line parasitic capacitance to an output node parasitic capacitance is 5:1, an oppositely charged output node 125 can provide a substantially immediate 20% drop in voltage when a write operation commences.

Thus, control of the output node 125 voltage level prior to a write operation can provide a more controlled and predictable write operation. In some embodiments of the device 100, the output node stabilization circuit 135 is part of the write strength selection circuit 130. Examples of output node stabilization circuits 135 are described below with reference to FIGS. 3 and 4.

Figure 2:
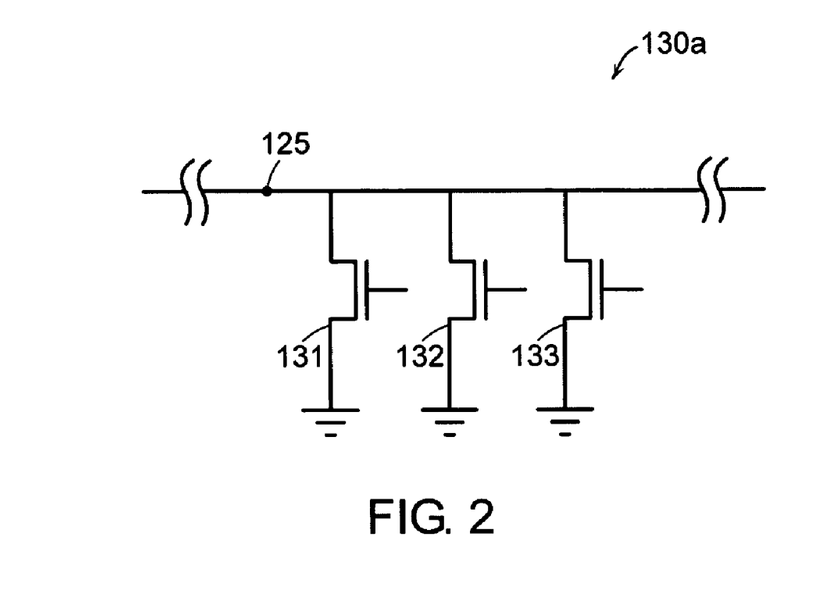
FIG. 2 is a schematic diagram of an embodiment of a write strength selection circuit, according to principles of the invention.

Referring now to FIG. 2, the write strength selection circuit 130 can include transistors to provide various degrees of impact on the discharge associated with a write operation. FIG. 2 is a schematic diagram of one embodiment of a write strength selection circuit 130a. The write strength selection circuit 130a includes a first transistor 131, to provide a strong write operation, and a second transistor 132, to provide a weak write operation. The write strength selection circuit 130a can include one or more additional transistors (for example, transistor 133) to provide additional weak write operations of varying write strength.

The transistors 131, 132, 133, when switched to an on state, can provide a current pathway between the output node 125 and ground. The transistors 131, 132, 133 are arranged in parallel so that one or more can be switched to an on state to selectably vary the write strength provided by the write strength selection circuit 130a.

The transistors 131, 132, 133 can all be of different types to individually provide, when selected, different write strength operations. For example, the transistors 131, 132, 133 can each have a different gate parameter, for example, a different W/L value. The three transistors 131, 132, 133, or more, can provide a ladder of write strength operations. For example, a sequence of at least some of the three or more transistors 131, 132, 133 can provide a ladder of transistors that each have double the strength of a preceding transistor. One of the transistors 131, 132, 133 can be chosen to have a gate parameter consistent with the smallest that can be reliably manufactured, with each successive transistors in the ladder of transistors having twice the width of a prior transistor in the ladder to provide both a fine granularity and a wide range of write strength control. The write strength selection circuit 130a can then provide an effective weak write value for a particular fabricated sample of the device 100, and can provide testing that is tailored to the operating frequency of the device 100.

The weakest of the transistors 131, 132, 133 can be left always in an on state. Thus, for example, the write strength selection circuit 130a can continuously be in a state for the weakest write available with one of the transistors 131, 132, 133 on. In this manner, the write strength selection circuit 130a can also tend to pull the output node 125 to ground between write operations. When stronger write operations are desired, more of the transistors 131, 132, 133 can be turned on.

More generally, the write strength selection circuit 130 can include a number of circuit elements, for example, transistors, capacitors, resistors, and/or inductors, electrically connected in series and/or parallel to the output node 125. The circuit elements can be selectable in numerous series and/or parallel combinations to provide numerous weak write operations and at least one strong write operation.

Thus, the write strength selection circuit 130 can have a selectable first impedance and a selectable second impedance greater than the first impedance. The first impedance is associated with a strong write operation and the second impedance is associated with a weak write operation. Moreover, the write strength selection circuit 130 thus has a strong write state associated with a first value of the at least one characteristic, and a weak write state associated with a second value of the at least one characteristic. The at least one characteristic can be, for example, a current level and/or a quantity of charge.

The write strength selection circuit 130 can be used to select an appropriate write strength in cooperation with the selection of a clock frequency at which the device 100 will operate. For example, an appropriate pull-down rate for a write operation will vary with the operating frequency of the device 100. By appropriate selection of write strength circuit 130 components, the device 100 can be programmed to function properly in response to a write operation. For example, after evaluation of the behavior of a particular sample of a fabricated device 100, an operating frequency can be selected, and the write strength circuit 130 can be programmed to provide a weak write strength of an effective level. For example, the weak write strength can be chosen to be strong enough to flip weak cells, but too weak to flip strong cells 110, i.e., cells 110 having no significant fabrication defect.

A programmable write strength selection circuit 130 provides several advantages. Lot-to-lot fabrication variability can lead to lot-to-lot variations in an appropriate strong write strength. Test structures can be added to wafers used in the fabrication process to identify these lot-to-lot variations. Once an appropriate write strength is determined, the write strength selection circuit 130 can be programmed to provide, for example, a weak write strength that is tailored to a particular lot of devices 110.

Alternatively, a suitable weak write strength can be determined theoretically, prior to device 110 fabrication. The device 110 can then be designed to provide a preselected single or set of write strengths. Since models can lead to errors in write strength selection, the above described empirical approach can be preferred. In response to an empirical evaluation of fabricated devices 100, the preselected single or set of write strengths can be selected.

Figure 3:
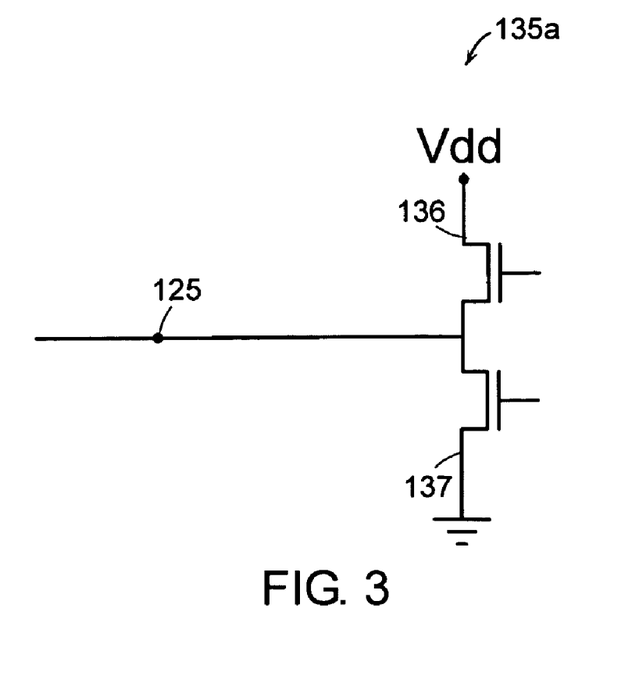
FIG. 3 is a schematic diagram of an embodiment of a output node stabilization circuit, according to principles of the invention.

FIG. 3 is a schematic diagram of one embodiment of a output node stabilization circuit 135a. The output node stabilization circuit 135a includes two transistors 136, 137. The source of one transistor 136 is connected to a supply voltage, the drain of the transistor 136 is connected to the source of the second transistor 137, and the drain of the second transistor 137 is connected to ground. By turning on one of the transistors 136, 137 while turning off the other one of the transistors 136, 137, the output node 125 can by pulled to the supply voltage level or to the ground voltage level, as will be understood by one having ordinary skill in the transistor circuit arts. For example, the transistor 136 can be turned on prior to a write operation to charge the output node 125, and then turned off prior to starting the write operation discharge.

When using transistor 136 to precharge the output node 125 to the supply voltage level, the transistors 131, 132, and 133 are preferably turned off. Also, for example, the transistor 136 can be used to pass a voltage other than the supply voltage by, for example, including additional voltage options, such as by including a voltage reference circuit.

Figure 4:
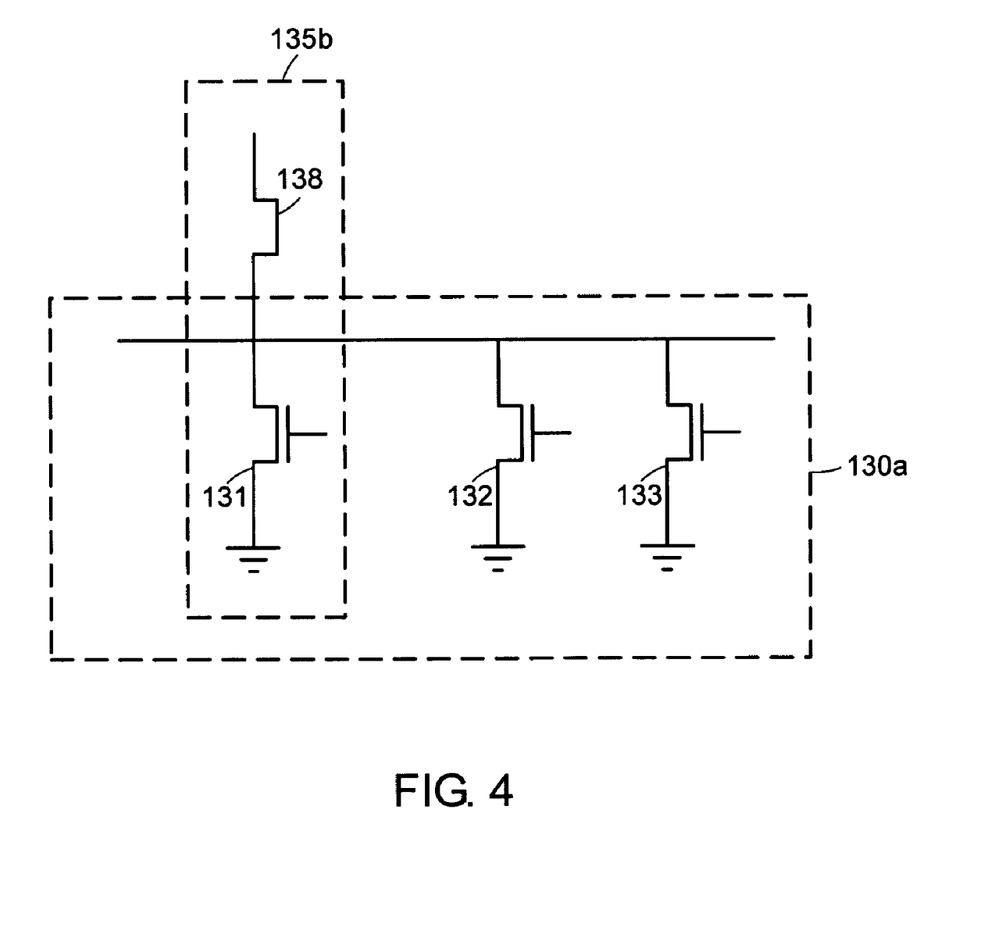
FIG. 4 is a schematic diagram of an embodiment of a output node stabilization circuit, according to principles of the invention.

FIG. 4 is a schematic diagram of another embodiment of a output node stabilization circuit 135b. The output node stabilization circuit 135b shares components with the write strength selection circuit 130a illustrated in FIG. 2. The output node stabilization circuit 135b includes a transistor 138 whose source is connected to a supply voltage level. The drain of the transistor 138 is connected to the sources of the transistors 131, 132, 133. Thus, the transistor 138, in cooperation with one or more of the transistors 131, 132, 133, can pull the output node 125 to the supply voltage level or to the ground voltage level.

Figure 5:
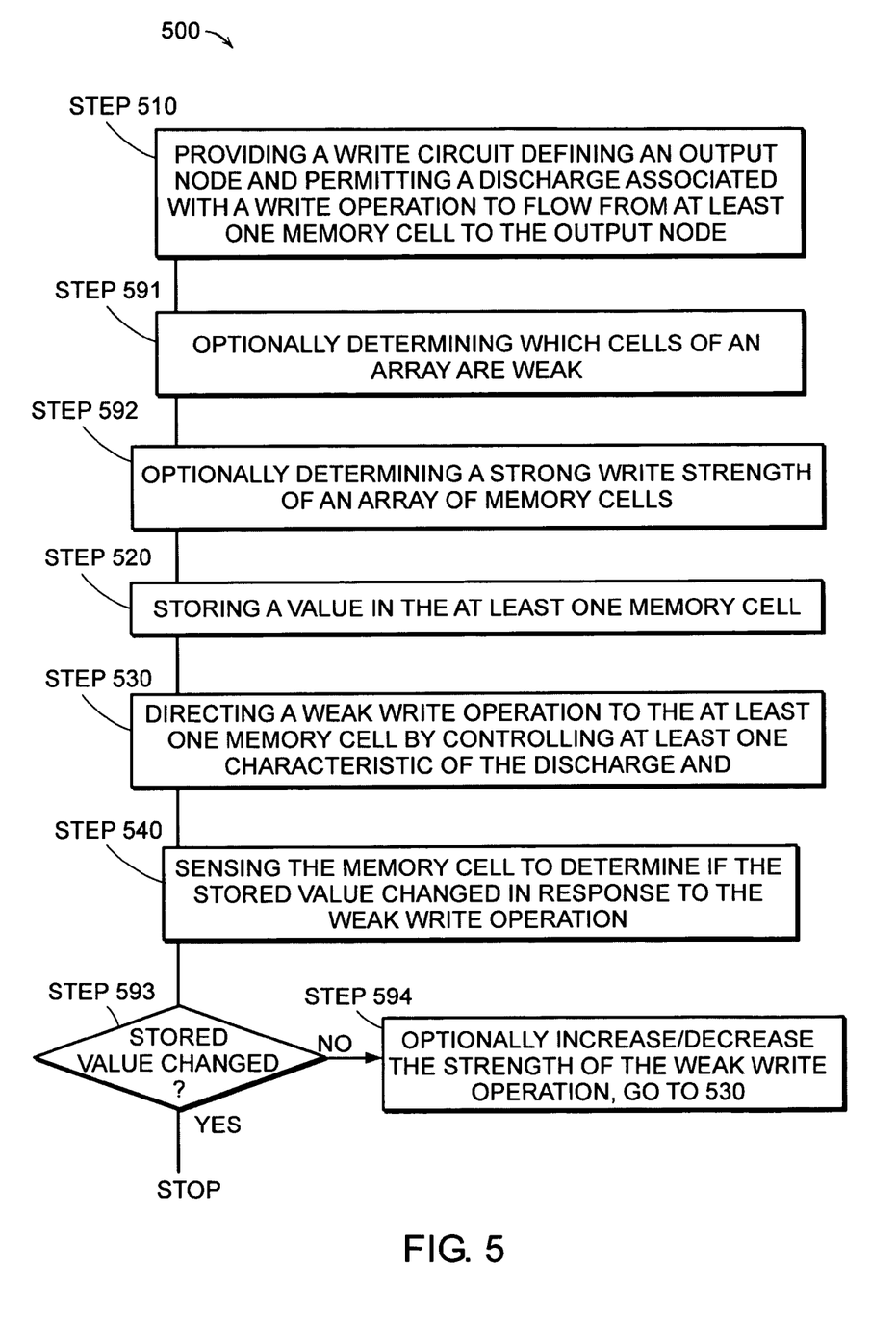
FIG. 5 is a flowchart of a method for testing data retention and failure analysis of an electronic memory device, according to principles of the invention.

FIG. 5 is a flowchart of a method 500 for testing data retention and failure analysis of an electronic memory device, according to principles of the invention. The method 500 can be implemented with, for example, the memory device 100 described above. The method 500 includes providing a write circuit (Step 510), storing a value in the at least one memory cell (Step 520), directing a weak write operation to the at least one memory cell (Step 530), and sensing the memory cell to determine if the stored value changed in response to the weak write operation (Step 540).

The write circuit defines an output node, and selectably connects the at least one memory cell to the output node to permit a discharge associated with a write operation to flow to the output node. The write circuit can be, for example, the write circuit 120 described above with reference to FIG. 1. The value can be stored in the at least one memory cell (Step 520) via a strong write operation. The weak write operation (Step 530) is accomplished by controlling at least one characteristic of the discharge flowing to the output node.

The memory device can include an array of memory cells. For example, the device can be an SRAM including an array of SRAM cells. The method can further include determining a strong write strength (Step 592). A determination of a strong write strength for normal operation of properly functioning cells also identifies a range of weak write strengths appropriate for retention testing and failure analysis purposes. The determination of the minimum write strength required to identify weak SRAM cells can assisted by including intentional defects in the array of memory cells. The intention defects can be selected to imitate the behavior of anticipated manufacturing defects. These defects can be located, for example, in regions otherwise not used, and can have no harmful affect on the nominal behavior of the array of memory cells.

The strong write strength of the array can be determined by empirical and/or theoretical means. For example, after fabrication, the array can be written to at a range of write strength levels to determine an appropriate write strength for normal (i.e., strong) write operations. Alternatively, an appropriate write strength can be determined from theoretical means that consider the design and processing parameters of the device. Empirical means can provide a more accurate determination due to fabrication variables that are difficult to assess via theoretical determinations.

The method 500 can be used for failure analysis of defective cells in an electronic memory device. That is, the method 500 can be used to identify the nature of a manufacturing defect that causes a cell to fail a data retention test. When applied to failure analysis, the method 500 can include a determination of which cells of an array are weak (Step 591). The weak cells can then be further tested to determine the write strength at which they fail.

For example, after a weak write (Step 530), if the stored value has not changed (Step 593), the strength of the weak write operation is increased (Step 594) and the cell is again written (Step 530) with the increased weak write strength. The weak write operations (Step 530, 540, 593, 594) can continue until a write strength is found at which the cell fails.

More generally, the strength of the weak write operation can be sequentially increased or decreased (Step 594) to sweep up or down through a range of write strengths. For example, one can sweep down from a strongest strength to find a minimum write strength that can successfully write "good" memory cells. Typically, there will be a weakest "good" memory cell, that is, a properly functioning cell that is more easily overwritten than any other properly functioning cell.

One can sweep up from a weakest strength to find "bad" memory cells. There may be different types of defective cells, failing at different strength levels, because different failure modes can have different associated write strengths to overwrite. Knowing both a minimum write strength to write "good" cells, and a maximum write strength required to write "bad" cells may be useful in the calibration of a single pass (no sweep) test of similar memories from the same manufactured lot or wafer. By choosing a write strength in between these two values, an allowance is made for a variation, even the greatest variation, in the actual behavior of other memories to be tested.

Further, intentional defects may be included in or with a memory device to assist calibration of write strengths to be used for testing. The intentionally included defects may imitate the behavior of anticipated manufacturing defects. This can be helpful when, for example, device yields are so good that very few defective cells accidentally occur. The defects can be positioned in regions otherwise not used for normal functioning of a memory device, and can have no harmful affect on the nominal behavior of an array of memory cells.

Figure 6:
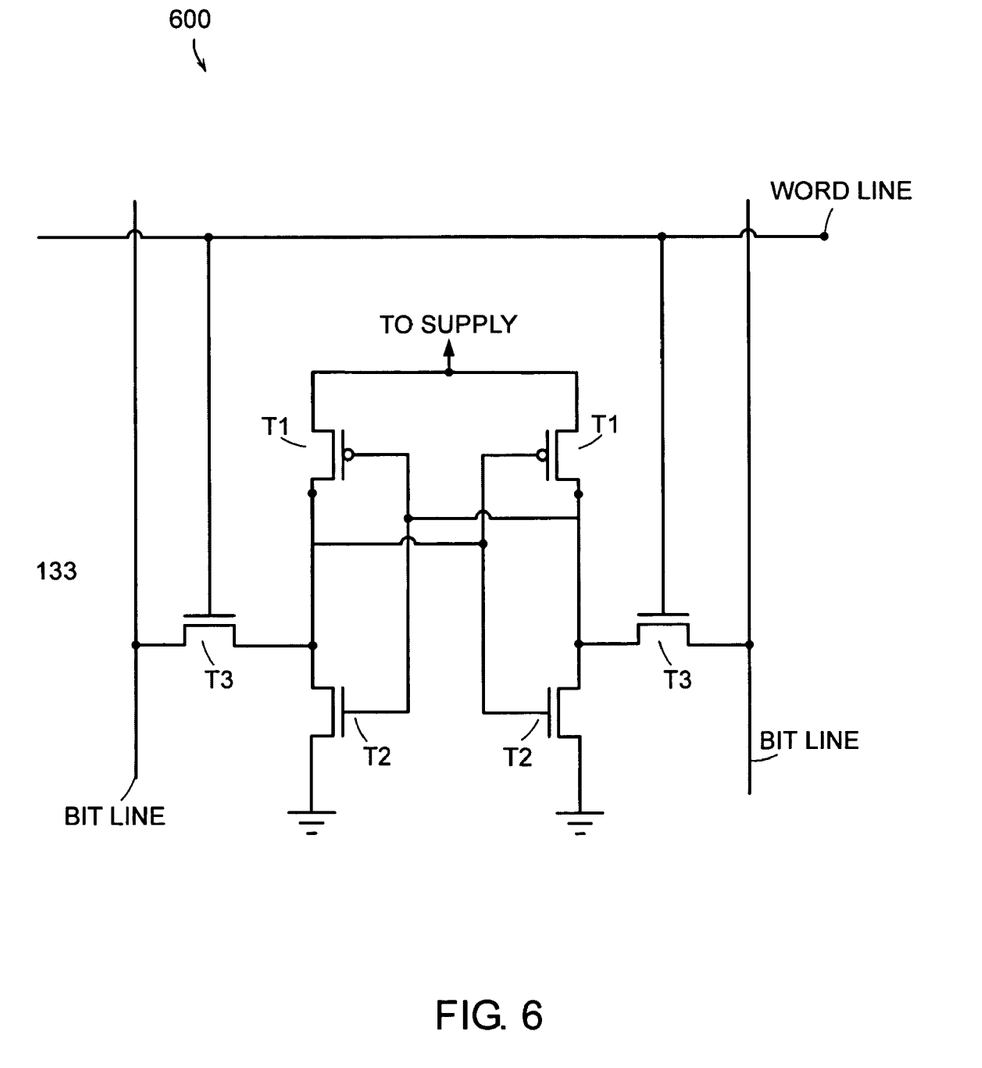
FIG. 6 is a schematic diagram of an embodiment of an SRAM cell that illustrates some failure mechanisms that can be identified with the method illustrated in FIG. 5.

FIG. 6 is a schematic diagram of an embodiment of an SRAM cell 600 that illustrates some failure mechanisms that can be identified with the method 500 described above. The cell 600 includes two p-type metal-oxide-semiconductor ("PMOS") transistors T1, and two n-type MOS ("NMOS") transistors T2 in a cross-coupled inverter configuration, and two access transistors T3.

The method 500 is well suited to detect, for example, defects in the PMOS T1 transistors. The method 500 can detect, for example, malformed PMOS transistors T1 and/or malformed interconnect extending from the transistors T1 to other components. A malformed PMOS transistor T1, as well as a malformed portion of interconnect, can act as, for example, an open or a resistive path. Sufficient charge can be trapped in the cell 600 after a write operation for a malformed cell 600 to hold the written state, but for a reduced period of time. The charge may leak to ground due to, for example, a malformed pull-up path.

A less than normal, i.e., less than strong, write current is required to overwrite a weak cell 600. A complete test sequence can include testing the cell 600 after initializing to a "0" state, and again testing the cell 600 after initializing to a "1" state. If desired, the location and type of an identified failure can be confirmed by other analytical means, for example, by microscopic examination.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An electronic memory device, comprising:
   at least one memory cell;
      a write circuit defining an output node, and selectably connecting the at least one memory cell to the output node to permit a discharge associated with a write operation to flow to the output node;
      a write strength selection circuit that modifies at least one characteristic of the discharge flowing to the output node, wherein the write strength selector circuit has a strong write state associated with a first value of the at least one characteristic, and a weak write state associated with a second value of the at least one characteristic.

2. The device of claim 1, wherein the write strength selection circuit has a selectable first impedance and a selectable second impedance greater than the first impedance, wherein the first impedance is associated with a strong write operation and a second impedance is associated with a weak write operation.

3. The device of claim 1, wherein the at least one characteristic is at least one of a current level and a quantity of charge.

4. The device of claim 1, wherein the write strength selection circuit comprises a first transistor, to provide a strong write operation, and a second transistor, to provide a weak write operation.

5. The device of claim 1, wherein the write strength selection circuit comprises a plurality of circuit elements electrically connected in parallel to the output of the write circuit, the plurality of circuit elements selectable in a plurality of combinations to provide a plurality of weak write operations and at least one strong write operation.

6. The device of claim 5, wherein the plurality of circuit elements comprise a plurality of transistors each having a different gate parameter.

7. The device of claim 1, wherein the at least one memory cell comprises a plurality of memory cells arranged in a plurality of rows and a plurality of columns, and further comprising a plurality of pass circuits associated with the plurality of columns, each of the plurality of pass circuits selectably connecting the associated column to the output node.

8. The device of claim 1, wherein the write circuit comprises at least one inverter.

9. The device of claim 1, wherein at least a portion of the discharge flowing to the output node flows through the output node.

10. The device of claim 1, wherein the at least one memory cell comprises a plurality of static random access memory cells.

11. The device of claim 1, wherein the write circuit comprises three inverters that selectably connect the at least one memory cell to the output node via one of a bit line and a complementary bit line.

12. The device of claim 1, further comprising an output node stabilization circuit in electrical communication with the output node to charge the output node to a preselected voltage level.

13. The device of claim 12, wherein the preselected voltage level is one of a write operation precharge voltage level, a ground voltage level, and a voltage level between the write operation precharge voltage level and the ground voltage level.

14. The device of claim 1, further comprising at least one failure-analysis memory cell that has an intentional defect.

15. A method for testing data retention of an electronic memory device comprising at least one memory cell, the method comprising:
   providing a write circuit defining an output node, and selectably connecting the at least one memory cell to the output node to permit a discharge associated with a write operation to flow to the output node;
   storing a value in the at least one memory cell;
   directing a weak write operation to the at least one memory cell by controlling at least one characteristic of the discharge flowing to the output node; and
   sensing the memory cell to determine if the stored value changed in response to the weak write operation.

16. The method of claim 15, wherein the memory device comprises an array of memory cells, and further comprising determining a strong write strength of the array by empirically determining an effective overwrite strength for the array of memory cells.

17. The method of claim 15, wherein directing a weak write operation comprises writing for a preselected period of time.

18. The method of claim 15, wherein controlling a current of the discharge comprises controlling an impedance of a circuit in electrical communication with the output node.

19. The method of claim 15, wherein the write strength circuit selectably provides a strong write strength and a plurality of weak write strengths, and further comprising writing to the memory cell with a greater one of the plurality of weak write strengths if the stored value has not changed.

20. A method for failure analysis of an electronic memory device comprising an array of memory cells, the method comprising:
   determining which cells of the array are weak;
   providing a write circuit defining an output node, and selectably connecting the at least one memory cell to the output node to permit a discharge associated with a write operation to flow to the output node;
   storing a value in the at least one memory cell;

directing a weak write operation to the at least one memory cell by controlling at least one characteristic of the discharge flowing to the output node; and sensing the at least one memory cell to determine if the stored value changed in response to the weak write operation; and repeating the weak write operation, with a greater write strength, until the stored value changes to determine a failure mode of the at least one memory cell.

21. The method of claim 20, further including the step of providing in the electronic memory device intentional defects that are associated with manufacturing defects, and determining the weak write strengths associated with the intentional defects to permit the determination of the failure mode of the at least one memory cell.

* * * * *